(12) United States Patent
Kubo et al.

(10) Patent No.: US 6,448,614 B2
(45) Date of Patent: Sep. 10, 2002

(54) CIRCUIT-INCORPORATING PHOTOSENSITIVE DEVICE

(75) Inventors: Masaru Kubo, Kitakatsuragi-gun; Toshihiko Fukushima, Nara; Zenpei Tani, Tondabayashi, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/864,861

(22) Filed: May 25, 2001

(30) Foreign Application Priority Data

May 30, 2000 (JP) ........................................ 2000-161260

(51) Int. Cl.⁷ .............................................. H01L 29/72
(52) U.S. Cl. ..................... 257/347; 257/348; 257/431; 257/439; 257/507; 257/517; 257/592; 257/616
(58) Field of Search .................................. 257/347, 348, 257/431, 439, 507, 517, 592, 616

(56) References Cited

U.S. PATENT DOCUMENTS

| | | | | |
|---|---|---|---|---|
| 5,656,128 A | * | 8/1997 | Hashimoto et al. | 257/347 |
| 5,706,067 A | * | 1/1998 | Colgan et al. | 257/347 |
| 5,747,860 A | * | 5/1998 | Sugiyama et al. | 257/347 |

FOREIGN PATENT DOCUMENTS

| | | |
|---|---|---|
| JP | 63-122285 | 5/1988 |
| JP | 6-61434 | 3/1994 |
| JP | 9-293893 | 11/1997 |

\* cited by examiner

*Primary Examiner*—Edward Wojciechowicz
(74) *Attorney, Agent, or Firm*—Nixon & Vanderhye P.C.

(57) ABSTRACT

A circuit-incorporating photosensitive device comprising: an SOI wafer including a first silicon substrate, a second silicon substrate, and an oxide film; a photodiode formed in a first region of the SOI wafer; and a signal processing circuit formed in a second region of the SOI wafer, wherein the photodiode includes a photosensitive layer formed of an SiGe layer.

14 Claims, 9 Drawing Sheets

X, Xs (Ge composition ratio: epitaxial film, substrate)
Value at bandgap 90K of $Si_{1-x}Ge_x$

CIRCUIT-INCORPORATING PHOTOSENSITIVE DEVICE

BACKGROUND OF THE INVENTION

1. Field of the Invention

The present invention relates to a circuit-incorporating photosensitive device using an SOI (Silicon on Insulator) wafer, and especially to a circuit-incorporating photosensitive device which has high sensibility and low power consumption.

2. Description of the Related Art

A circuit-incorporating photosensitive device is widely used as an optical pickup, optical communication, or a photosensor, e.g., a photocoupler. In recent years, there has been intense demand for the higher sensibility, faster operation, and lower power consumption of circuit-incorporating photosensitive devices in all such applications.

FIG. 8 is a cross-sectional view illustrating the structure of a conventional circuit-incorporating photosensitive device 400. The conventional circuit-incorporating photosensitive device 400 shown in FIG. 8 has a laminated structure of a P-type silicon substrate 1 and an N-type silicon substrate 4 epitaxially grown on the P-type silicon substrate 1. In this laminated structure, a photodiode 270, and a bipolar transistor 280 which is a circuit for processing signals output from the photodiode 270 are integrally provided. The N-type silicon substrate 4 is separated into plural regions by P-type embedded diffusion layers 13. The photodiode 270 and the bipolar transistor 280 are respectively provided in the regions separated by the P-type embedded diffusion layers 13.

The photodiode 270 is of a PN junction type, formed with the laminated structure of the P-type silicon substrate 1 and the N-type silicon substrate 4.

The bipolar transistor 280 has a P-type diffusion layer 7 formed in the N-type silicon substrate 4 near the surface thereof. An N-type diffusion layer 8 is formed in the P-type diffusion layer 7. Furthermore, the N-type silicon substrate 4 includes an N-type diffusion layer 6 which extends from the surface of the N-type silicon substrate 4 to an N-type diffusion layer 12.

An oxide film layer 9 is provided on the entire surface of the N-type silicon substrate 4. In the bipolar transistor 280 region, the oxide film layer 9 is provided with wiring 10a connected to the N-type diffusion layer 6, wiring 10b connected to the P-type diffusion layer 7, and wiring 10c connected to the N-type diffusion layer 8 (which is embedded near the surface of the P-type diffusion layer 7).

In the circuit-incorporating photosensitive device 400 having such a structure, the photosensitivity of the photosensitive portion of the photodiode 270 depends on the photosensitivity at the PN junction, as well as the amount of the light absorption corresponding to the size and thickness of the photodiode 270.

In a circuit-incorporating photosensitive device used as an optical pickup, light having a wavelength of about 635 nm for DVD applications, about 780 nm for CD applications, about 850 nm for space optical transmission, or about 950 nm for a photosensor (e.g., a photocoupler) is normally used. The light absorption coefficients of silicon (Si) and light penetration depths into silicon for these wavelengths are shown in Table 1.

TABLE 1

| Wavelength | Light absorption coefficient | Penetration depth | Light absorptance in an active layer of 1 μm |
|---|---|---|---|
| 650 nm | 2500 cm$^{-1}$ | 4 μm | 22% |
| 780 nm | 1200 cm$^{-1}$ | 8.5 μm | 11% |
| 850 nm | 800 cm$^{-1}$ | 12.5 μm | 8% |
| 950 nm | 400 cm$^{-1}$ | 25 μm | 4% |

As shown in Table 1, the depths to which these light wavelengths penetrate into silicon are no less than 4 μm. Normally, the depths are greater than the thickness of the N-type silicon substrate 4 which forms the circuit-incorporating photosensitive device 400. Thus, the PN junction between the N-type silicon substrate 4 and the P-type silicon substrate 1 is used to improve the photosensitivity of the photodiode 270 and to improve the absorptance at these light wavelengths.

On the other hand, for faster operation and lower power consumption, it is effective to use a SiGe layer (which has a higher light absorptance) as a base layer, as well as an SOI (Silicon on Insulator) wafer, as shown in, for example, Japanese Laid-Open Publication No. 6-61434.

FIG. 9 is a cross-sectional view illustrating a circuit-incorporating photosensitive device 410 in which an SOI wafer 290 is used. The SOI wafer 290 includes a silicon substrate 1 and an N-type silicon substrate 4, with an N-type diffusion layer 3 formed on a lower surface thereof and an oxide film 2 interposed therebetween.

The N-type silicon substrate 4 of the SOI wafer 290 is separated into plural regions by trench-type separation layers 5. A photodiode 270 and a bipolar transistor 280 are respectively provided in the regions separated by the trench-type separation layers 5. The trench-type separation layers 5 extend from the surface of the N-type silicon substrate 4, through the N-type diffusion layer 3, so as to reach the oxide film 2.

In the photodiode 270, a P-type diffusion layer 7a, which serves as an active layer, is formed near the surface of the N-type silicon substrate 4. An N-type diffusion layer 6 is provided so as to extend from the surface of the N-type silicon substrate 4 to the N-type diffusion layer 3.

In an NPN-type bipolar transistor 280 which is a signal processing circuit of the photodiode 270, a base layer 7b formed of SiGe is embedded as a P-type diffusion layer near the surface of the N-type silicon substrate 4. An N-type diffusion layer 8 is provided near the surface of the base layer 7b. Furthermore, in the N-type silicon substrate 4, an N-type diffusion layer 6 is provided so as to extend from the N-type silicon substrate 4 to the N-type diffusion layer 3.

An oxide film 9 is provided on the entire surface of the N-type silicon substrate 4. In the NPN-type bipolar transistor 280 region, the oxide film 9 is provided with an electrode 10a connected to the N-type diffusion layer 6, a base electrode 10b connected to the base layer 7b, and an electrode 10c connected to the N-type diffusion layer 8 (which is embedded near the surface of the base layer 7b).

In the circuit-incorporating photosensitive device 410 having such a structure, the thickness of the silicon layer 7a, which serves as an active layer forming the photosensitive portion of the photodiode 270, is normally about 1 μm, so that there is a problem in that the amount of light absorption is small. Table 1 also shows the light absorptance at different wavelengths in the case where the thickness of the silicon active layer 7a is 1 μm. The light absorptance is 22% for a light wavelength of 650 nm, 11% for a light wavelength of 780 nm, 8% for a light wavelength of 850 nm, and 4% for a light wavelength of 950 nm.

The photodiode 270 has a low photosensitivity because the amount of the light absorption of each of the silicon photosensitive layers 3a, 4a, and 7a is small.

The output of the photodiode 270 having such a low photosensitivity could be subjected to gain compensation by the signal processing circuit. However, when the gain of the output is compensated, the response speed of the signal processing circuit and the signal-to-noise ratio (S/N ratio) may decrease.

SUMMARY OF THE INVENTION

According to one aspect of the invention, there is provided a circuit-incorporating photosensitive device comprising: an SOI wafer comprising a first silicon substrate, a second silicon substrate, and an oxide film; a photodiode formed in a first region of the SOI wafer; and a signal processing circuit formed in a second region of the SOI wafer, wherein the photodiode comprises a photosensitive layer comprising an SiGe layer.

In one embodiment of the invention, the photosensitive layer is formed after the signal processing circuit is formed.

In one embodiment of the invention, the photosensitive layer is provided in a recess formed in the SOI wafer.

In one embodiment of the invention, the signal processing circuit comprises a high-speed transistor, and at least a portion of the high-speed transistor is formed of an SiGe layer.

In one embodiment of the invention, the SiGe layer of the photosensitive layer and the SiGe layer of the high-speed transistor are simultaneously formed.

In one embodiment of the invention, the photodiode has a reflection film provided on a bottom surface thereof.

In one embodiment of the invention, the reflection film includes a high melting point metal film.

In one embodiment of the invention, an antireflection film is provided on the photosensitive layer.

In one embodiment of the invention, the antireflection film comprises an SiN film.

In one embodiment of the invention, a thermal oxide film is formed between the photosensitive layer and the SiN layer.

In one embodiment of the invention, the antireflection film is integrally formed of the photosensitive layer.

In one embodiment of the invention, the antireflection film includes an amorphous carbon film.

In one embodiment of the invention, a phase difference between light impinging upon the photosensitive layer and light reflecting at the bottom surface of the second silicon substrate is ½ of the wavelength of the light impinging upon the photosensitive layer.

In one embodiment of the invention, the photosensitive layer is separated into plural photosensitive regions by a trench-type separation layer.

In one embodiment of the invention, the photosensitive layer is separated into plural photosensitive regions by forming the photosensitive layer with a selective epitaxial growth method.

Thus, the invention described herein makes possible the advantage of providing a circuit-incorporating photosensitive device with high-sensibility, fast operation, and low power consumption, which prevents a decrease in the S/N ratio.

This and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described in detail with reference to the figures.

(Example 1)

Figure 1:
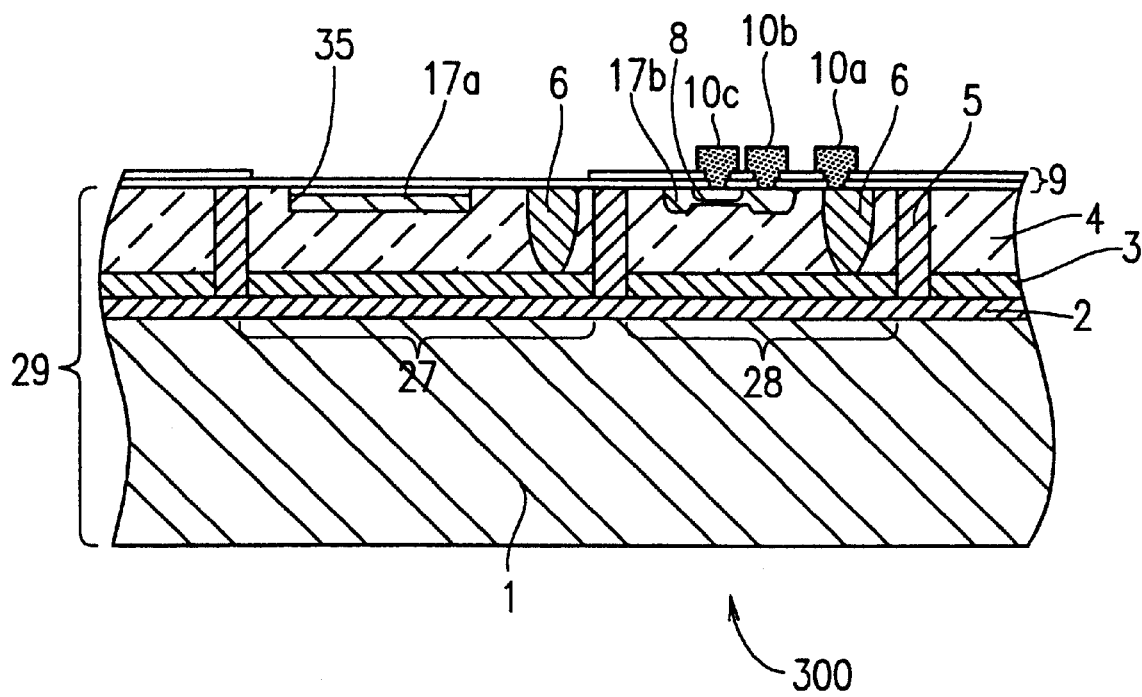
FIG. 1 is a cross-sectional view illustrating a circuit-incorporating photosensitive device according to an example of the present invention.

FIG. 1 is a cross-sectional view illustrating a circuit-incorporating photosensitive device 300 according to Example 1 of the present invention. The circuit-incorporating photosensitive device 300 shown in FIG. 1 comprises an SOI wafer 29. In the circuit-incorporating photosensitive device 300, an N-type silicon substrate 4 having an N-type diffusion layer 3 formed on a lower surface thereof is provided on a silicon substrate 1, with an oxide film 2 (e.g., $SiO_2$) interposed between the N-type diffusion layer 3 and the silicon substrate 1. Since the SOI wafer 29 has a small parasitic capacitance, the circuit-incorporating photosensitive device 300 using the SOI wafer 29 can operate fast while requiring low power consumption.

The SOI wafer 29 includes a photodiode 27 and a bipolar transistor 28, which are formed in regions separated by trench-type separation layers 5 provided in the N-type silicon substrate 4. The photodiode 27 comprises a photosensitive layer (formed of SiGe) 17a for receiving light. The bipolar transistor 28 constitutes a signal processing circuit of the photodiode 27. The trench-type separation layers 5 extend from the surface of the N-type silicon substrate 4, through the N-type diffusion layer 3, so as to reach the oxide film 2.

The SiGe photosensitive layer 17a is formed near the surface of the N-type silicon substrate 4 in the photodiode 27. Specifically, the region near the surface of the N-type silicon substrate 4 is etched away to a depth corresponding to the thickness of the photosensitive layer 17a, thereby forming a recess 35. The photosensitive layer 17a is formed by growing a crystal of SiGe in the recess 35. The photosensitive layer 17a serves as the photosensitive region of the photodiode 27. Furthermore, in the N-type silicon substrate 4 of the photodiode 27, an N-type diffusion layer 6 is provided which extends from the surface of the N-type silicon substrate 4 to the N-type diffusion layer 3.

The photosensitive layer 17a of the photodiode 27 is embedded in the recess 35 provided in the N-type silicon substrate 4, and the surface of the photosensitive layer 17a is planed so as to become flush with the surface of the N-type silicon substrate 4. Any wiring provided on the surface is similarly planed.

The bipolar transistor 28, which serves as a signal processing circuit of the photodiode 27, includes a base layer (formed of SiGe) 17b near the surface of the N-type silicon substrate 4. An N-type diffusion layer 8 is formed in the base layer 17b. Furthermore, the N-type silicon substrate 4 includes an N-type diffusion layer 6 which extends from the surface of the N-type silicon substrate 4 to the N-type diffusion layer 3.

An oxide film layer 9 is provided on the entire surface of the N-type silicon substrate 4. In the bipolar transistor 28 region, the oxide film 9 is provided with metal wiring 10a connected to the N-type diffusion layer 6, metal wiring 10b connected to the base layer 17b, and metal wiring 10c connected to the N-type diffusion layer 8, which is formed in the base layer 17b.

The circuit-incorporating photosensitive device 300 includes; a photodiode 27 which has significantly improved photosensitivity because the photosensitive layer 17a which is formed of SiGe having a high light absorptance is provided in the photosensitive region of the photodiode 27. Furthermore, since the base layer 17b of the bipolar transistor 28 is also formed of SiGe, the carrier injection efficiency of the bipolar transistor 28 is increased. Thus, the current amplification hfe is increased, thereby enabling faster operation than in conventional circuit-incorporating devices.

Figure 2:
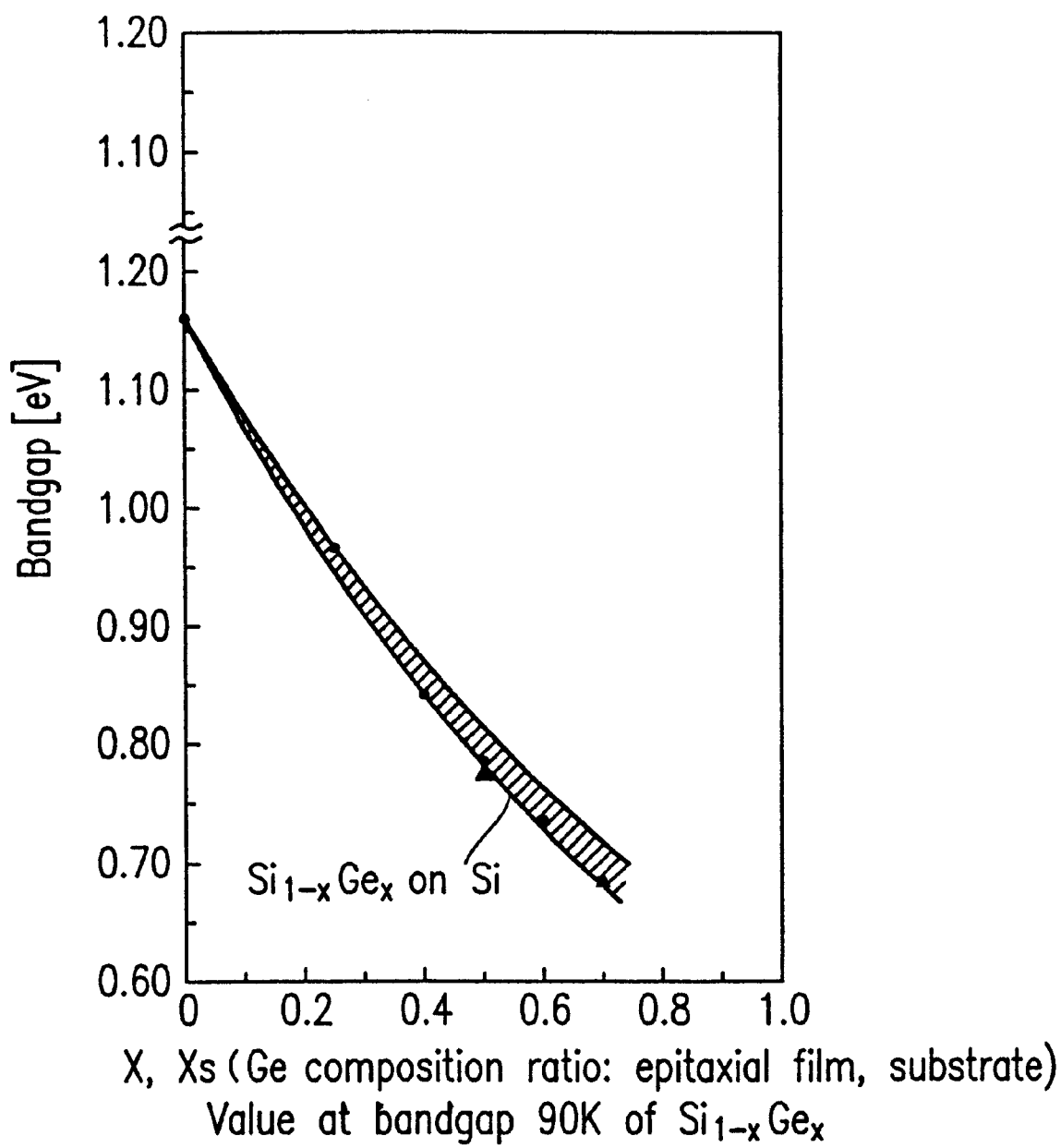
FIG. 2 is a diagram illustrating a relationship between a composition ratio of an SiGe layer and a bandgap thereof.
Figure 3:
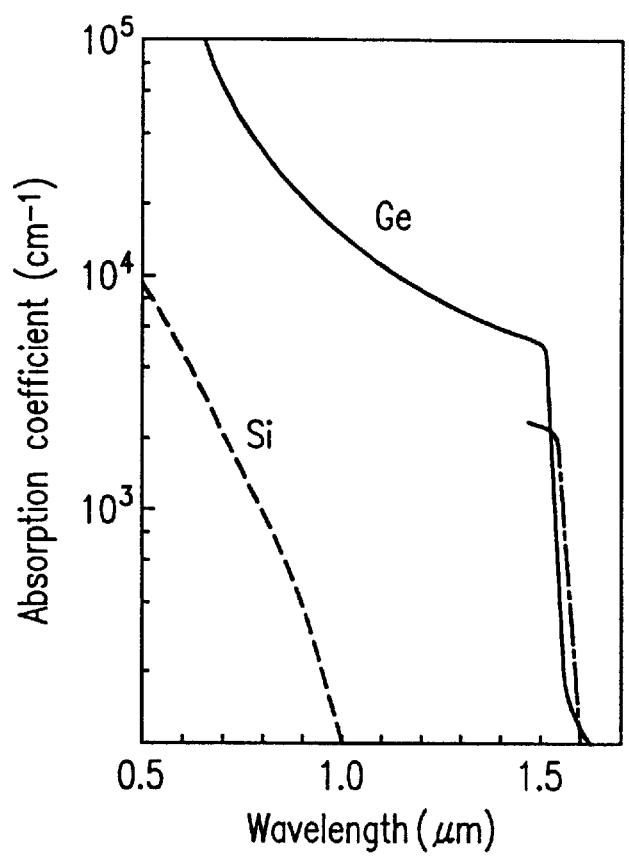
FIG. 3 is a graph illustrating a relationship between wavelengths of irradiated light and absorption coefficients of an Si layer and a Ge layer.

FIG. 2 is a graph illustrating a relationship between the composition ratio between Si and Ge in the SiGe layer and the bandgap thereof. FIG. 3 is a graph illustrating a relationship between the absorption coefficient and the wavelength of light with which the Si layer and the Ge layer are irradiated. As shown in FIG. 2, the bandgap of the SiGe layer varies in accordance with the composition ratio between Si and Ge. As the concentration of Ge relative to Si increases, the bandgap of the SiGe layer becomes narrower. As the bandgap becomes narrower, the absorption coefficient increases. Thus, the photosensitivity of the photodiode 27 featuring the SiGe photosensitive layer 17a increases, and faster operation can be obtained.

Furthermore, the Si layer and Ge layer have different absorption coefficients as shown in FIG. 3. Thus, by using an SiGe layer which is intercrystallized with Si and Ge, the overall absorption coefficient significantly increases at certain wavelengths as compared to the case of using Si alone.

In the circuit-incorporating photosensitive device 300 shown in FIG. 1, the photosensitive layer 17a of the photodiode 27 is designed with a thickness of not more than about 1 $\mu$m from the perspective of crystallinity. In order to ensure that a light amount of 1—1/e is absorbed in such a photosensitive layer 17a having a thickness of 1 $\mu$m, an absorption coefficient of about 10000 $cm^{-1}$ will be required. Therefore, in order to improve the photosensitivity of the photodiode 27 as shown in FIG. 1, the composition ratio between Si and Ge in the photosensitive layer 17a is set so that the absorption coefficient in the wavelength band of received light is about 10000 $cm^{-1}$ or more.

The SiGe layer forming the photosensitive layer 17a (i.e., the active layer of the photodiode 27) and the SiGe layer forming the base layer 17b of the bipolar transistor 28 are provided near the surface of the N-type silicon substrate 4. Thus, the SiGe layers can be formed simultaneously and the number of steps required for fabricating the circuit-incorporating photosensitive device 300 is not increased.

Furthermore, each of the SiGe layers can be a multilayer film or a superlattice layer. By employing a multilayer film or a superlattice layer, the carrier injection efficiency can be increased without increasing the thickness of the layers.

It is preferable to avoid a heat treatment after the SiGe layer is formed because the composition and the properties of the SiGe layer will be changed if it is subjected to a high temperature after it is formed. Thus, in the circuit-incorporating photosensitive device 300 shown in FIG. 1, it is preferable to form the photosensitive layer 17a and the base layer 17b (both of which are SiGe layers) after completing a heat diffusion process which may be used to form the bipolar transistor 28.

(Example 2)

Figure 4:
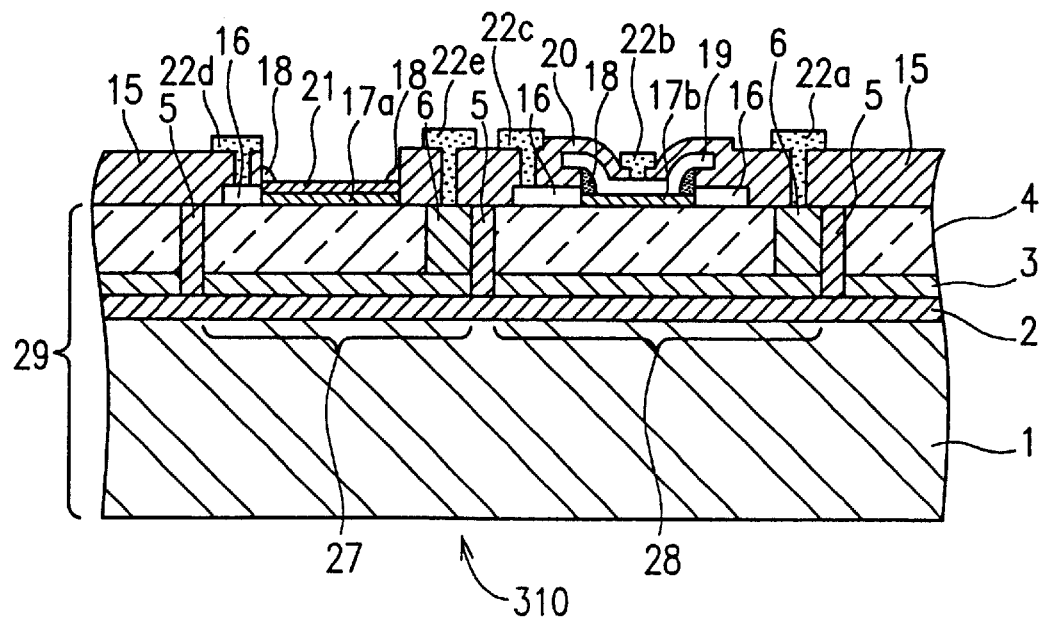
FIG. 4 is a cross-sectional view illustrating a circuit-incorporating photosensitive device according to an example of the present invention.

FIG. 4 is a cross-sectional view illustrating a circuit-incorporating photosensitive device 310 according to Example 2 of the present invention. Similarly to the circuit-incorporating photosensitive device 300, the circuit-incorporating photosensitive device 310 shown in FIG. 4 comprises an SOI wafer 29. In the SOI wafer 29, a silicon substrate 4 having an N-type diffusion layer 3 formed on a lower surface thereof is provided on a silicon substrate 1, with an oxide film 2 interposed between the N-type diffusion layer 3 and the silicon substrate 1.

The SOI wafer 29 includes a photodiode 27 and a bipolar transistor 28, which are formed in regions separated by trench-type separation layers 5 provided in the N-type silicon substrate 4. The photodiode 27 comprises a photosensitive layer (formed of SiGe) 17a for receiving light. The bipolar transistor 28 constitutes a signal processing circuit of the photodiode 27. The trench-type separation layers 5 extend from the N-type silicon substrate 4 through an N-type diffusion layer 3 so as to reach the oxide film 2. In each of the regions where the photodiode 27 and the bipolar transistor 28 are formed, an N-type diffusion layer 6 is provided along each trench-type separation layer 5 so as to extend from the surface of the N-type silicon substrate 4 to the N-type diffusion layer 3.

In the photodiode 27, a photosensitive layer 17a formed of SiGe is laminated on the surface of the N-type silicon substrate 4. On the photosensitive layer 17a, an antireflection film 21 is laminated. To a side of the photosensitive layer 17a and the antireflection film 21 which are laminated together, a polysilicon layer 16 doped with P-type impurities is provided on the surface of the N-type silicon substrate 4 to bring the anode of the photodiode 27 into conduction. The regions other than the laminated portion of the photosensitive layer 17a and the antireflection film 21 are covered with an oxide insulator film 15. On the edge of each side of the photosensitive layer 17a and the antireflection film 21, a sidewall spacer 18 is provided.

In the oxide insulator film 15, metal wiring 22d and 22e are provided as electrodes extend through the oxide insulator film 15 and contacting the polysilicon layer 16 and the N-type diffusion layer 6, respectively.

In the bipolar transistor 28, a base layer 17b formed of SiGe layer is laminated on the surface of the N-type silicon substrate 4. To each side of the base layer 17b, a polysilicon layer 16 doped with P-type impurities is provided on the surface of the N-type silicon substrate 4 to bring the base electrode of the bipolar transistor 28 into conduction. The regions other than the base layer 17b and the polysilicon layer 16 are covered with an oxide insulator film 15.

On the base layer 17b, a polysilicon layer 19 doped with N-type impurities is laminated so as to form an emitter. Sidewall spacers 18 are respectively interposed between either end of the base layer 17b and the polysilicon layer 19. Each side of the polysilicon layer 19 is embedded in the oxide insulator layer 15. The surface of the polysilicon layer 19 is also covered with the oxide insulator layer 15.

In the oxide insulator film 15, metal wiring 22a, 22b and 22c are respectively provided as electrodes extending through the oxide insulator film 15 and contacting the N-type diffusion layer 6, the base layer 17b and the polysilicon layer 16.

In order to simplify description, multilayer wiring, overcoat, etc., provided in the circuit-incorporating photosensitive device 310 are omitted in FIG. 4.

The photosensitive layer 17a and the base layer 17b can be formed of a multilayer film or a superlattice layer of SiGe.

FIGS. 5A to 5F are cross-sectional views illustrating a fabrication process of the circuit-incorporating photosensitive device 310 shown in FIG. 4. The method for fabricating the circuit-incorporating photosensitive device 310 is described with reference to FIGS. 5A to 5F.

Figure 5A:
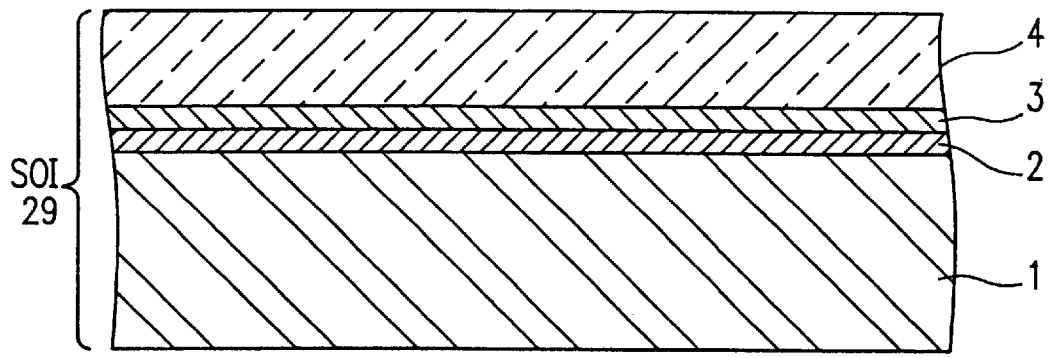
FIGS. 5A to 5F are cross-sectional views illustrating steps of a fabrication method of a circuit-incorporating photosensitive device according to an example of the present invention.

First, as shown in FIG. 5A, the N-type silicon substrate 4 having the N-type diffusion layer 3 formed on a lower surface thereof is provided on the silicon substrate 1, with the oxide film 2 interposed between the N-type diffusion layer 3 and the silicon substrate 1, thus forming the SOI wafer 29.

In the case where the bipolar transistor 28 formed in the SOI wafer 29 is a CMOS transistor, the N-type diffusion layer 3 is not required. The substrate 4 is not necessarily N-type, but may be of P-type. Furthermore, the SOI wafer 29 may be formed by adhering the silicon substrate 1 and the silicon substrate 4 together, or by a method such as SIMOX.

Figure 5B:
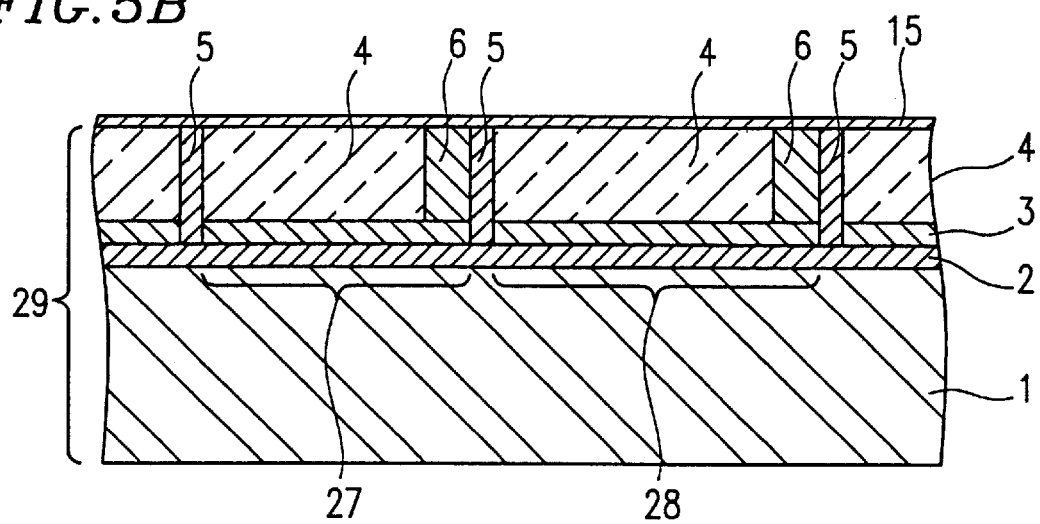

Next, as shown in FIG. 5B, at the border of the regions of the silicon substrate 4 where the photodiode 27 and transistor 28 are to be formed, the trench-type separation layers 5 are formed. Each separation layer 5 is formed along the direction of thickness of the silicon substrate 4 so as to extend from the surface of the silicon substrate 4, through the N-type diffusion layer 3, to the oxide film 2. After each separation layer 5 is formed, in the regions where the photodiode 27 and the bipolar transistor 28 are respectively formed, the N-type diffusion layers 6 are formed along each trench-type separation layer 5. Then, the oxide film 15 is formed on the entire surface of the N-type silicon substrate 4.

After formation, the oxide film 15 of a central portion of the regions where the photodiode 27 and the bipolar transistor 28 are respectively formed is removed by etching to expose the surface of the N-type silicon substrate 4. On the exposed surface of the N-type silicon substrate 4 in the region defining the photodiode 27, the polysilicon layer 16 doped with N-type impurities (see FIG. 5C) is formed to bring the anode of the photodiode 27 into conduction. On the exposed surface of the N-type silicon substrate 4 in the region defining the bipolar transistor 28, the polysilicon layer 16 doped with P-type impurities (see FIG. 5C) is formed to bring the base electrode of the bipolar transistor 28 into conduction.

Figure 5C:
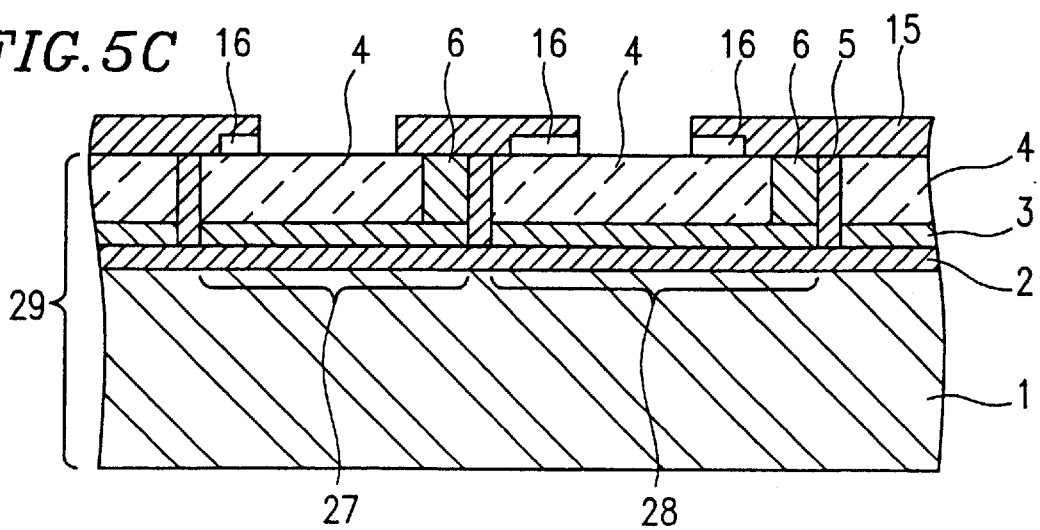

Next, as shown in FIG. 5C, portions of the oxide film 15 and the polysilicon layers 16 are removed by etching to expose the surface of the N-type silicon substrate 4 except at the farther end (from the N-type diffusion layer 6) of the polysilicon layer 16 in the region defining the photodiode 27. Also, the oxide film 15 and the polysilicon layers 16 are removed by etching to expose the surface of the N-type silicon substrate 4 except at both ends of the polysilicon layer 16 in the region defining the bipolar transistor 28.

Figure 5D:
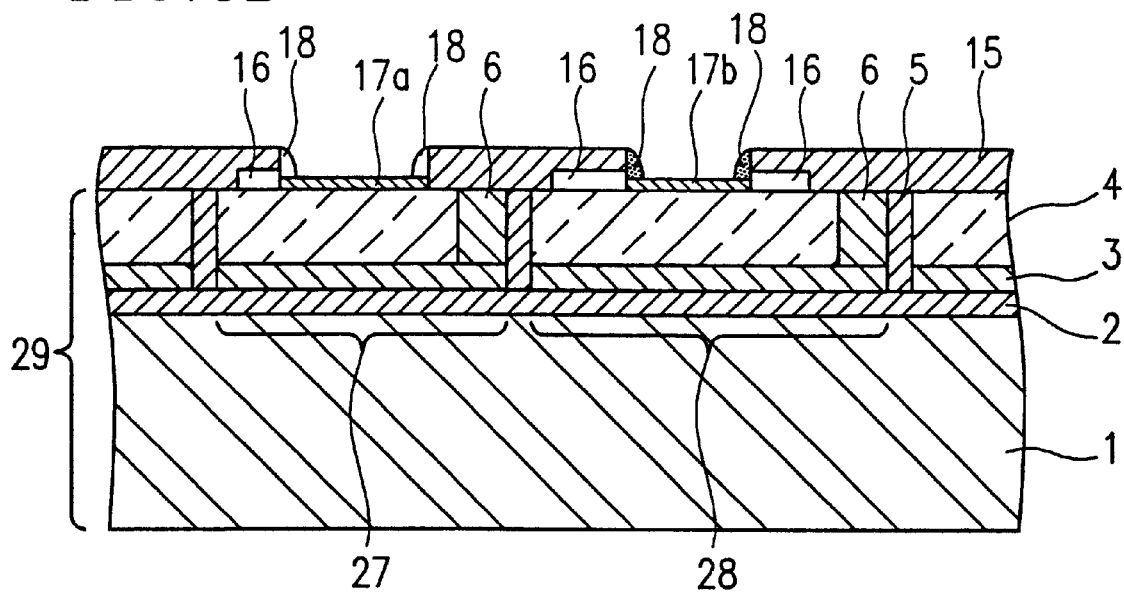
Figure 7:
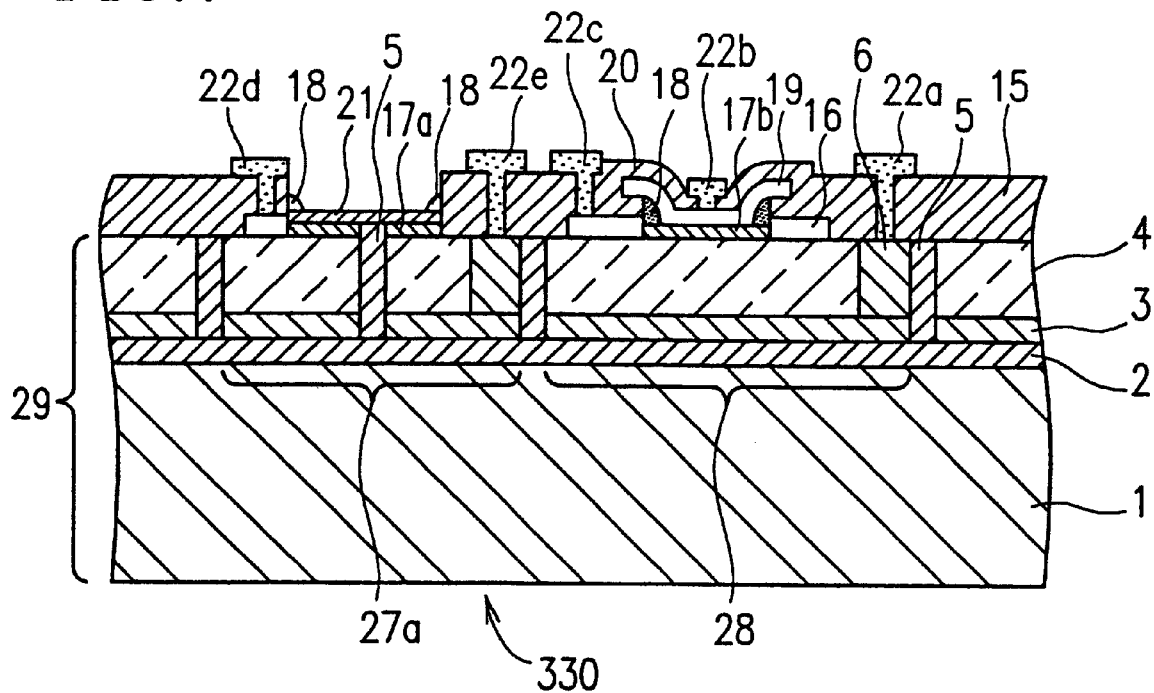
FIG. 7 is a cross-sectional view illustrating a circuit-incorporating photosensitive device according to an example of the present invention.
Figure 8:
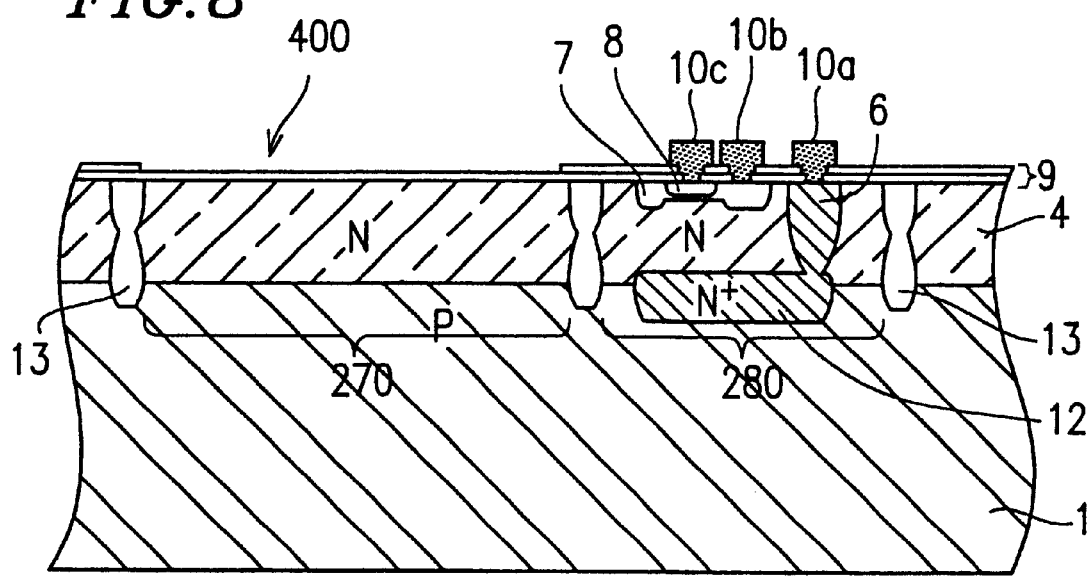
FIG. 8 is a cross-sectional view illustrating an exemplary conventional circuit-incorporating photosensitive device.
Figure 9:
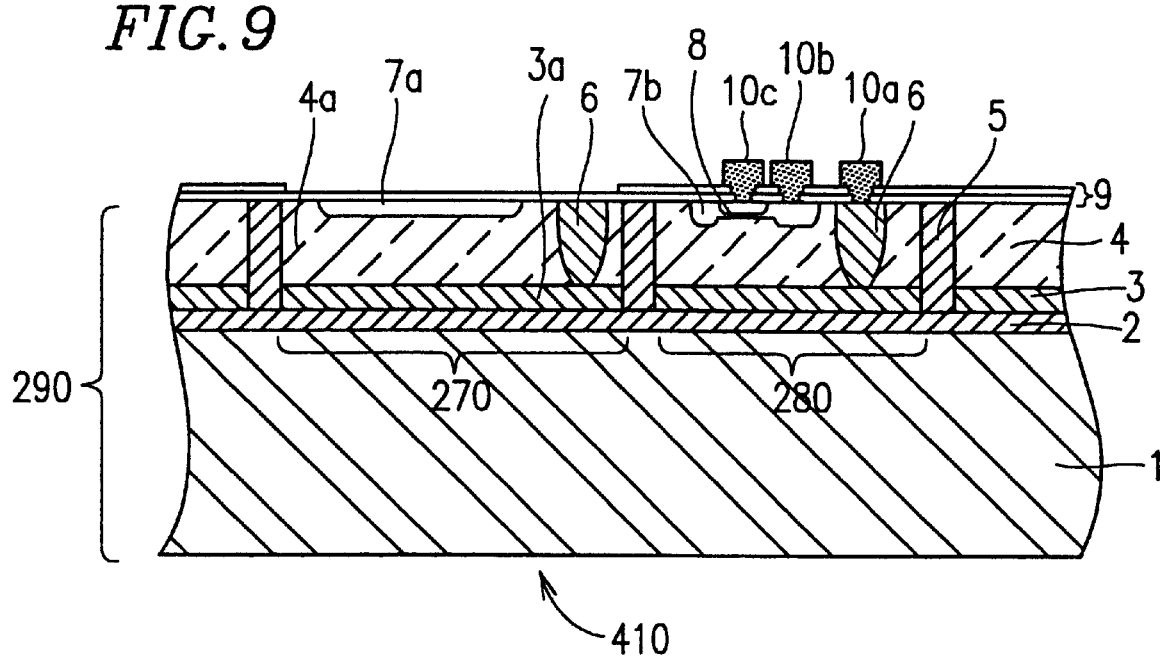
FIG. 9 is a cross-sectional view illustrating an exemplary conventional circuit-incorporating photosensitive device having an SOI structure.

Next, as shown in FIG. 5D, SiGe layers are simultaneously formed on the exposed surface of the N-type silicon substrate 4 in the regions defining the photodiode 27 and the bipolar transistor 28, through selective growth by a method such as MBE. Thus, the photosensitive layer 17a as a photosensitive region of the photodiode 27 and the base layer 17b of the bipolar transistor 28 are formed at the same time. By simultaneously forming the photosensitive layer 17a and base layer 17b with SiGe, the number of fabrication steps can be decreased. Alternatively, the photosensitive layer 17a may be formed by a selective epitaxial method. In this case, as shown in FIG. 7, the photosensitive layer 17a can be formed into separate plural photosensitive regions.

Figure 5E:
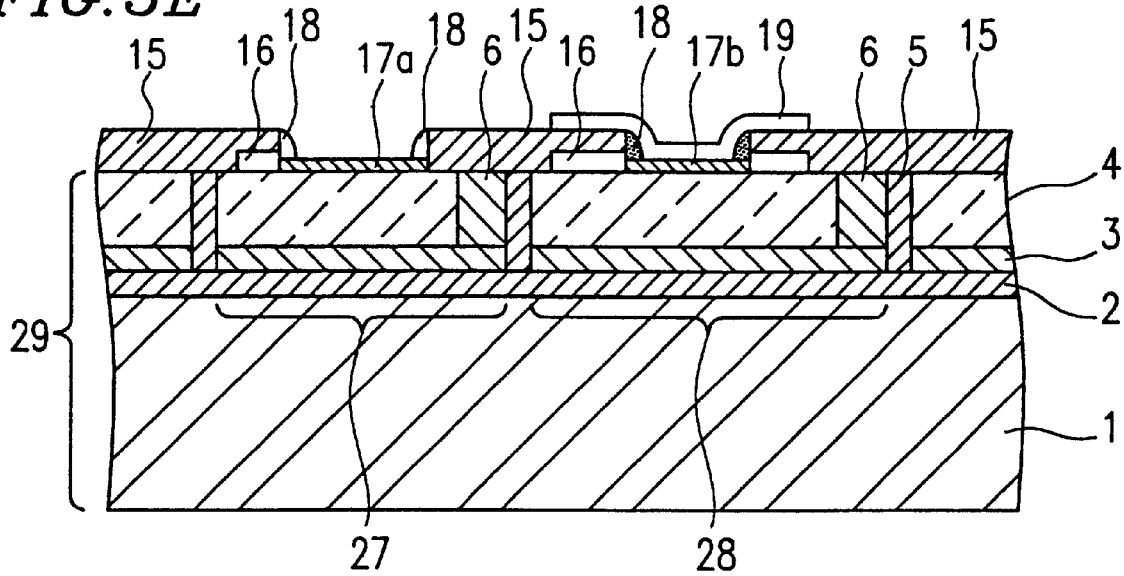

Next, sidewall spacers 18 are provided on the respective edge portions of at both ends of the photosensitive layer 17a and the base layer 17b. Then, as shown in FIG. 5E, the polysilicon layer 19 doped with N-type impurities is formed on the base layer 17b and on a portion of the oxide film 15 covering the polysilicon layer 16 next to the base layer 17b.

Figure 5F:
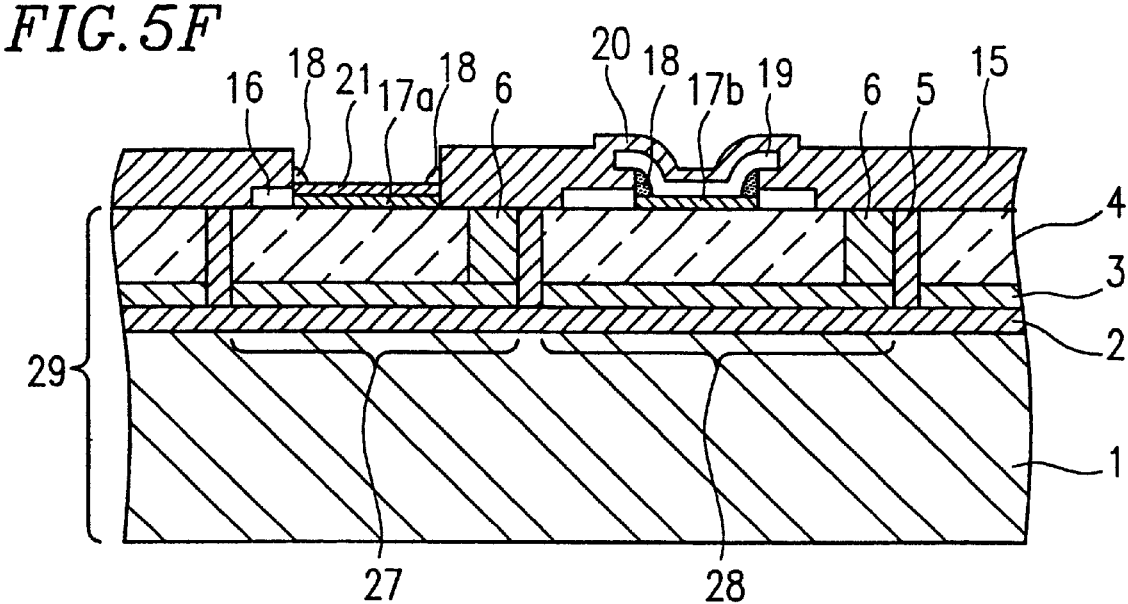

Next, as shown in FIG. 5F, the antireflection film 21 is formed on the photosensitive layer 17a in the region where the photodiode 27 is located. Then, an oxide film 20 is formed on portions other than the antireflection film 21 by CVD, or the like.

By adjusting the Ge concentration of the surface side of the photosensitive layer 17a formed of SiGe so as to be smaller than that of the internal side, a potential barrier is formed. Thus, surface recombination is restrained to prevent the photosensitivity from being lowered.

Figure 5G:
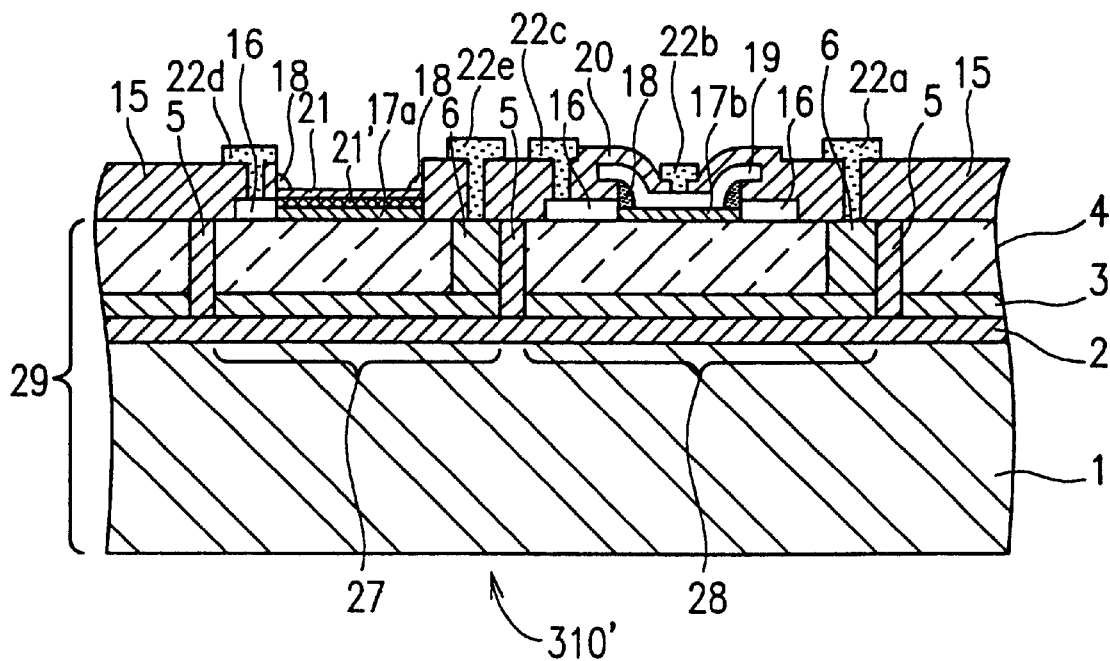
FIG. 5G is a cross-sectional view illustrating a circuit-incorporating photosensitive device according to an example of the present invention.

Thus, by adjusting the Ge concentration of the SiGe layer forming the photosensitive layer 17a to be small, the surface recombination can be restrained. Thus, an SiN film can be integrally formed on the surface of the photosensitive layer 17a as the antireflection film 21. As the circuit-incorporating photosensitive device 310' shown in FIG. 5G, a thermal oxide film 21', such as $SiO_2$, may be formed on the surface of the photosensitive layer 17a first, and then an SiN film may be formed as the antireflection film 21. An amorphous carbon film which can be formed at a low temperature may be formed as the antireflection film 21.

Contact holes are provided in the oxide film 15 in the region defining the photodiode 27, such that the contact holes reach the surfaces of the polysilicon layer 16 and the N-type diffusion layer 6, respectively. In each of the formed contact holes, metal wiring 22d or 22e is provided to form an electrode. In the region defining the bipolar transistor 28, contact holes which reach one of the polysilicon layer 16, the polysilicon layer 19 on the base layer 17b and the N-type diffusion layer 6 are formed. In each of the formed contact holes, metal wiring 22a, 22b or 22c is provided to form an electrode. Thus, the circuit-incorporating photosensitive device 310 shown in FIG. 4 is completed.

The circuit-incorporating photosensitive device 310 includes the photosensitive layer 17a, which is formed of an SiGe layer having a high light absorptance serving as the photosensitive region of the photodiode 27. Thus, the photosensitivity of the photodiode 27 is significantly improved. Also, since the base layer 17b of the bipolar transistor 28 is formed of SiGe, the injection efficiency of the carriers in the bipolar transistor 28 is increased. Therefore, the current amplification hfe can be higher and a faster operation is achieved.

Moreover, since the antireflection layer 21 is provided on the photosensitive layer 17a of the photodiode 27, light impinging upon the photosensitive layer 17a can be absorbed effectively, which also improves the photosensitivity of the photodiode 27.

For the antireflection film 21 provided on the photosensitive layer 17a, an amorphous carbon film which can be grown at a low temperature of 100° C. or less is particularly preferable. The composition and the properties of SiGe which forms the photosensitive layer 17a will be affected by a high-temperature heat treatment. Therefore, if the amorphous carbon film is grown at the temperature of 100° C. or less, the composition of SiGe which forms the photosensitive layer 17a will not change.

Furthermore, to reduce the reflection of the light at the surface of the photosensitive layer 17a, the thickness of the photosensitive layer 17a and the silicon substrate 4 may be adjusted to be an integer multiple of $\lambda/4n$ ($\lambda$: the wavelength of the light, n: the index of the refraction), so that the phase difference between the light impinging upon the photosensitive layer 17a formed of SiGe and the light through the photosensitive layer 17a reflecting from the bottom surface of the silicon substrate 4 will be about $\lambda/2$. Thus, the photosensitivity of the photodiode 27 can be further improved.

(Example 3)

Figure 6:
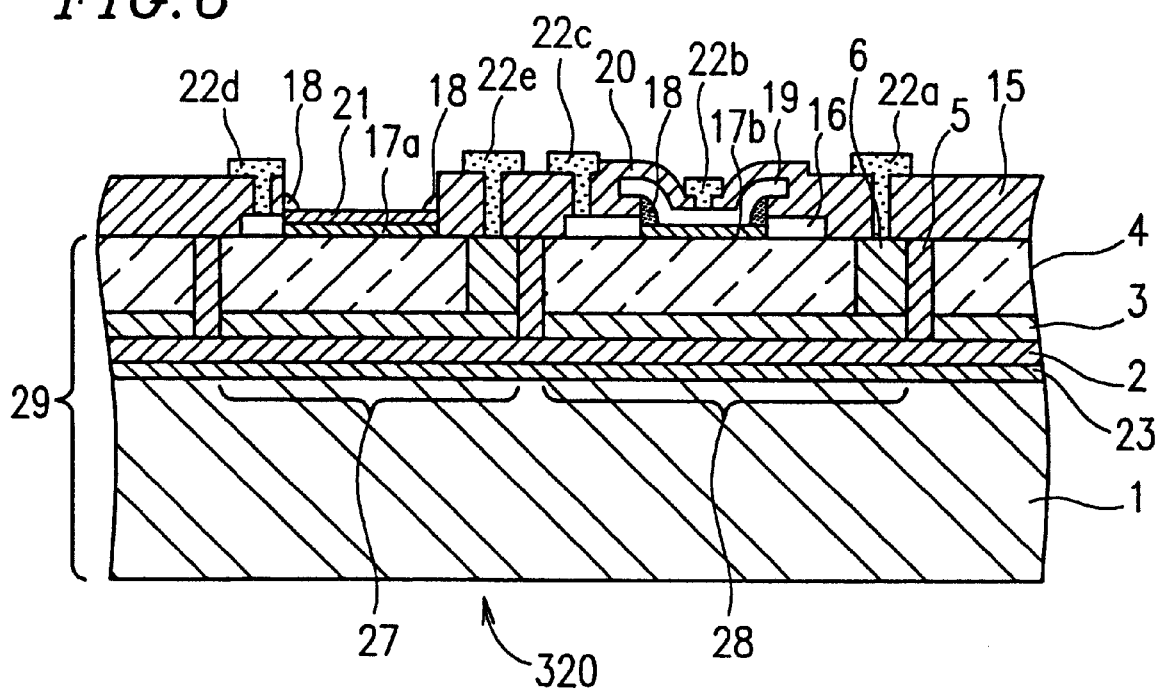
FIG. 6 is a cross-sectional view illustrating a circuit-incorporating photosensitive device according to an example of the present invention.

FIG. 6 is a cross-sectional view of a circuit-incorporating photosensitive device 320 according to Example 3 of the present invention. In the circuit-incorporating photosensitive device 320, a reflection film 23 which is formed of a high melting point metal film is provided on the silicon substrate 1. The structure is similar to that of the circuit-incorporating photosensitive device 310 except for the reflection film 23.

The light transmitted through the photosensitive layer 17a is reflected from the reflection film 23 so as to return to the photosensitive layer 17a. Thus, the photosensitive layer 17a can obtain a level of photosensitivity which is equal to that of a twice-as-thick photosensitive layer. Furthermore, a high melting point metal film which forms the reflection film 23 can be sputtered to the surface of either one of the silicon substrate 1 or the N-type silicon substrate 4 which are adhered together when forming the SOI wafer 29.

When the proportion of Ge is increased so as to increase the light absorption coefficient of the photosensitive layer 17a formed of SiGe, the distortion of the Si layer will be greater and the crystallinity will be lowered. Therefore, the photosensitive layer 17a may not be thick enough to sufficiently absorb light. However, with the circuit-incorporating photosensitive device 320, the light can be absorbed sufficiently with a thin photosensitive layer 17a by providing the reflection film 23.

In the above-described Examples 1–3, the description is made with respect to the photodiode 27 having a single photosensitive layer 17a which is not segmented. However, as in the circuit-incorporating photosensitive device 330 shown in FIG. 7, the N-type silicon substrate 4 and the photosensitive layer 17a may be separated into plural photosensitive regions by the trench-type separation layers 5. In this case, a segmented photodiode, preferably used as an optical pickup or a camera device, is provided. By separating the photosensitive regions of a photodiode 27a into a plurality of regions by the trench-type separation layers 5, the photodiode 27a becomes free from crosstalk and thus, high resolution can be achieved. Since the photosensitive layer 17a formed of SiGe may be formed by a selective epitaxial method, the photosensitive layer 17a may be separated into plural regions when the photosensitive layer 17a is formed thorough such selective epitaxial growth.

As described above, in the circuit-incorporating photosensitive device according to the present invention, a photodiode having a photosensitive layer formed of SiGe and a signal processing circuit are provided on an SOI wafer which has lower power consumption. Thus, the photodiode can achieve higher photosensitivity, and the signal processing circuit can have lower gain. Accordingly, the response speed in the signal processing circuit, the S/N ratio, etc., can be prevented from decreasing. Furthermore, by providing a high-speed transistor having a portion formed of SiGe on the same SOI wafer as a signal processing circuit, the speed of the signal processing is increased, and a photosensitive device with fast operation, high sensitivity and low power consumption can be provided.

Various other modifications will be apparent to and can be readily made by those skilled in the art without departing from the scope and spirit of this invention.

Accordingly, it is not intended that the scope of the claims appended hereto be limited to the description as set forth herein, but rather that the claims be broadly construed.

What is claimed is:

1. A circuit-incorporating photosensitive device comprising:
    an SOI wafer comprising a first silicon substrate, a second silicon substrate, and an oxide film;
    a photodiode formed in a first region of the SOI wafer; and
    a signal processing circuit comprising a transistor formed in a second region of the SOI wafer,
    wherein the photodiode comprises a photosensitive layer comprising SiGe and the transistor includes a base layer comprising SiGe.

2. A circuit-incorporating photosensitive device according to claim 1, wherein the photosensitive layer is formed after the signal processing circuit is formed.

3. A circuit-incorporating photosensitive device according to claim 1, wherein the photosensitive layer is provided in a recess formed in the SOI wafer.

4. A circuit-incorporating photosensitive device according to claim 1, wherein the photosensitive layer comprising SiGe and the transistor base layer comprising SiGe are simultaneously formed.

5. A circuit-incorporating photosensitive device according to claim 1, wherein the photodiode has a reflection film provided on a bottom surface thereof.

6. A circuit-incorporating photosensitive device according to claim 5, wherein the reflection film includes a high melting point metal film.

7. A circuit-incorporating photosensitive device according to claim 1, wherein an antireflection film is provided on the photosensitive layer.

8. A circuit-incorporating photosensitive device according to claim 7, wherein the antireflection film comprises an SiN film.

9. A circuit-incorporating photosensitive device according to claim 8, wherein a thermal oxide film is formed between the photosensitive layer and the SiN film.

10. A circuit-incorporating photosensitive device according to claim 7, wherein the antireflection film is integrally formed of the photosensitive layer.

11. A circuit-incorporating photosensitive device according to claim 7, wherein the antireflection film includes an amorphous carbon film.

12. A circuit-incorporating photosensitive device according to claim 1, where a phase difference between light impinging upon the photosensitive layer and light reflecting at the bottom surface of the second silicon substrate is ½ of the wavelength of the light impinging upon the photosensitive layer.

13. A circuit-incorporating photosensitive device according to claim 1, wherein the photosensitive layer is separated into plural photosensitive regions by a trench-type separation layer.

14. A circuit-incorporating photosensitive device according to claim 1, wherein the photosensitive layer is separated into plural photosensitive regions by forming the photosensitive layer with a selective epitaxial growth method.

* * * * *